United States Patent [19]

Fujiyama et al.

[11] Patent Number: 4,526,644

[45] Date of Patent: Jul. 2, 1985

[54] TREATMENT DEVICE UTILIZING PLASMA

[75] Inventors: Yasutomo Fujiyama, Kawasaki; Osamu Kamiya, Machida, both of Japan

[73] Assignee: Canon Kabushiki Kaisha, Tokyo, Japan

[21] Appl. No.: 596,804

[22] Filed: Apr. 4, 1984

[30] Foreign Application Priority Data

Apr. 5, 1983 [JP] Japan ................................ 58-59672

[51] Int. Cl.³ ...................... H01L 21/306; B44C 1/22; C03C 15/00; C03C 25/06
[52] U.S. Cl. .................................. 156/345; 118/50.1; 118/620; 118/730; 156/643; 156/646; 204/192 E; 204/298
[58] Field of Search ....................... 156/345, 643, 646; 204/164, 192 E, 298; 427/38, 39; 118/715, 50, 50.1, 620, 728-730; 134/1, 94, 99, 102, 201

[56] References Cited

U.S. PATENT DOCUMENTS

| 4,243,506 | 1/1981 | Ikeda et al. ..................... 156/345 X |
| 4,368,092 | 1/1983 | Steinberg et al. .................. 156/345 |
| 4,424,096 | 1/1984 | Kumagai ........................ 156/345 X |

FOREIGN PATENT DOCUMENTS 57-68027  4/1982  Japan ................................ 156/345

*Primary Examiner*—William A. Powell
*Attorney, Agent, or Firm*—Fitzpatrick, Cella, Harper & Scinto

[57] ABSTRACT

A treatment device utilizing plasma performs treatment by exposing a material to be treated to a plasma atmosphere formed by converting at least either one of fluorine and a fluorine compound into gas plasma, and said device comprises a structural member for forming the space for maintaining said plasma atmosphere, which is constituted of a stainless steel structure member coated on its surface exposed to said plasma atmosphere with a metal film which can difficultly form a fluoride.

3 Claims, 1 Drawing Figure

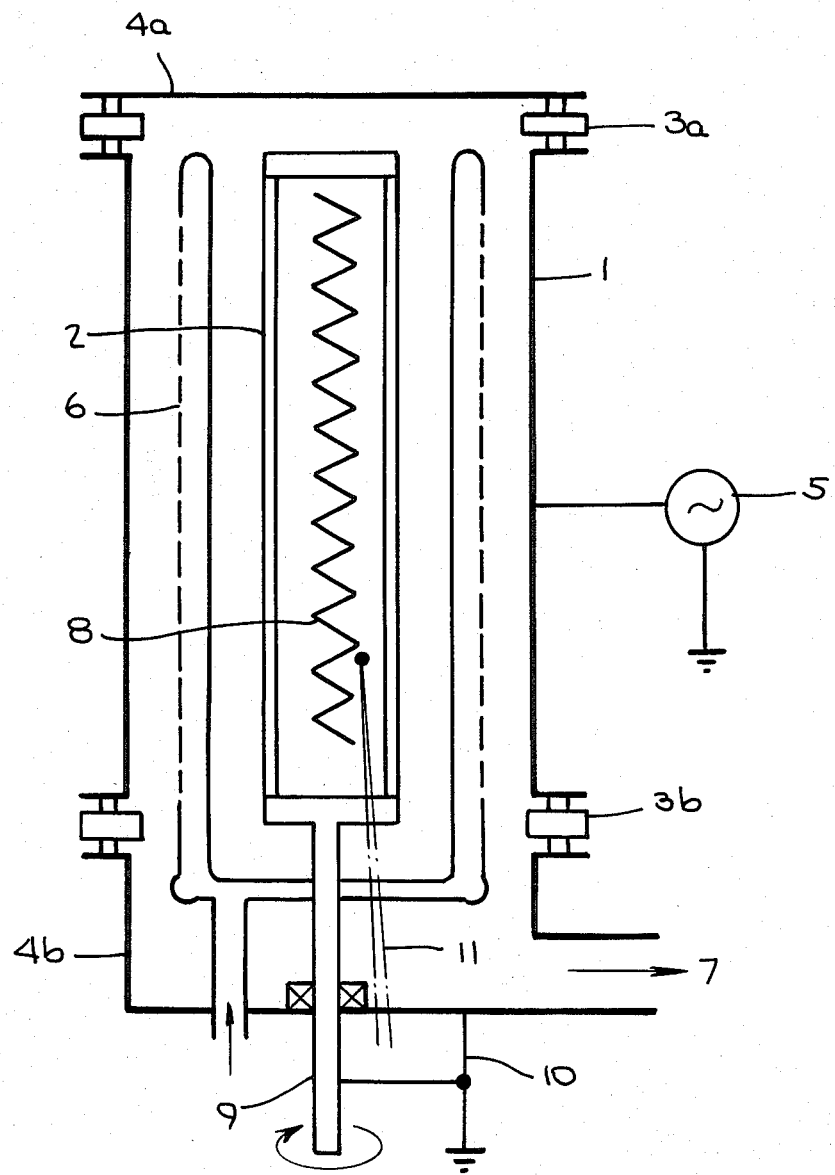

TREATMENT DEVICE UTILIZING PLASMA

BACKGROUND OF THE INVENTION

1. Field of the Invention

This invention relates to a treatment device utilizing plasma, which is suitable for etching treatment or cleaning removal treatment of silicon or silicon compound in a plasma atmosphere of fluorin or fluorin compound, or for thin film formation treatment to deposit a thin film of silicon on silicon compound on a support.

2. Description of the Prior Art

In the prior art, structural members for vacuum device have been desired to have surfaces which are stable chemically and thermally, and to emit gases in an amount as small as possible when under vacuum.

For this reason, as a general practice, stainless steels have been used for structural members in vacuum devices for which vacuum of high quality is required in connection with semiconductors.

The situation is the same in gas-phase method devices, and stainless steels have been used not only for vacuum tanks but also for internal implements such as high frequency electrodes.

However, in plasma etching devices employing these stainless steels, when forming, for example, semiconductor circuits by etching of silicon wafer with the use of a fluorocarbon type gas such as $CF_4$ as the etching gas, the surface of the stainless structural member exposed to the plasma atmosphere will be corroded with fluorine radicals formed in said plasma, whereby milky white iron trifluoride ($FeF_3$) powder will be formed on the surface.

This $FeF_3$ is formed on the surface of stainless steel through the chemical reaction between fluorine radicals and iron contained as the main component of stainless steel. Consequently, deterioration in strength of the stainless structural member and contamination within the reaction chamber by fluorine will proceed.

Further, $FeF_3$ formed and deposited on the surface of stainless structural member is very fragile and thus can be readily peeled off from the structural member surface, with the fragments of $FeF_3$ floating in the reaction chamber until attached on the surface of the material to be etched, which may cause generation of undesirable failures in etching.

Among the examples of the prior art, it is also proposed to use SUS 316 steel with lower iron content as compared with SUS 304 steel as the anticorrosive structural member. Even in such a structural member, since the main component is iron, a minute amount of $FeF_3$ will be formed on its surface, thereby causing formation of dust and fluorine contamination. Also, in the case when forming a vapor deposited film on a substrate in a plasma atmosphere of $SiF_4$, there will ensue a similar problem on account of $FeF_3$ formed from the stainless structural member within the gas-phase method device. Further, when a deposited layer is formed in the gas-phase method device according to such a method as heating vapor deposition, sputtering vapor deposition, electron beam vapor deposition or CVD (chemical vapor deposition), the material to be deposited will be adhered even onto the portions other than the substrate for deposit formation within the gas-phase method device. If such adherents are left to remain as such, inconveniences will be brought about similarly as in the case of iron trifluoride. Therefore, also in the case of removing these adherents by cleaning with a plasma atmosphere of a fluorine compound gas, the stainless structural member in the gas-phase method device reacts with the gas to form iron trifluoride, thus posing the problem that the object of cleaning cannot be accomplished.

SUMMARY OF THE INVENTION

An object of the present invention is to provide a treatment device utilizing plasma which has overcome such problems of the prior art.

According to the present invention, there is provided a treatment device utilizing gas plasma which performs treatment by exposing a material to be treated to a plasma atmosphere formed by converting at least either one of fluorine and a fluorine compound into gas plasma, which device comprises a structural member for forming the space for maintaining said plasma atmosphere, which is constituted of a stainless steel structural member coated on its surface exposed to said plasma atmosphere with a metal film which can only with difficulty form a fluoride.

BRIEF DESCRIPTION OF THE DRAWING

FIG. 1 is a schematic illustration of a preferred embodiment for the treatment device of the present invention.

DETAILED DESCRIPTION OF THE PREFERRED EMBODIMENTS

The treatment device utilizing plasma of the present invention has a structural member for forming the space for maintaining said plasma atmosphere, which is constituted of a stainless steel structural member coated on its surface exposed to said plasma atmosphere with a metal film which can difficultly form a fluoride. With such a constitution of the device, formation of $FeF_3$ is prevented to prevent the structural member from corrosion simultaneously with prevention of generation of dust by etching or cleaning, whereby it is rendered possible to remove the causes for generation of poor etching or pinholes on the vapor deposited later.

As the fluorine compound gas, there may be employed fluorinated hydrocarbon type gases such as $CF_4$, $CHF_3$, $C_2F_6$, $C_4F_8$, $CBrF_3$, etc. or a polyhalide gas such as $SF_6$, which have been known as gases for dry etching. If desired, it is also possible to incorporate oxygen gas as a mixture with a fluorine compound gas.

As the metal film which can difficultly form a fluoride under a plasma atmosphere, there may be employed those of nickel, chromium, gold, aluminum, copper, silver and tin. In particular, aluminum, nickel and chromium are preferred. Such a metal film may be provided by coating on a stainless steel structural member according to such a method as metal plating, vapor deposition, or the like.

The treatment device utilizing plasma in accordance with a preferred embodiment of the present invention and shown in FIG. 1 is constituted of a cylindrical wall member 1, a circular upper wall member 4a and a cylindrical lower wall member 4b. These wall members 1, 4a, 4b are combined with electrically insulating annular insulators 3a, 3b and constitute a reaction chamber wall. Cylindrical wall member 1 is connected to a high frequency power source 5 and functions as the cathode. In the center of the bottom of lower wall member 4b, there is provided a rotating mechanism 9 for rotating a cylindrical substrate 2 comprising aluminum, etc. as set and fixed on rotating mechanism 9. The rotating mechanism 9 rotates together with substrate 2 during the operation of the device, e.g., during the reaction of a starting gas as mentioned below to make uniform a thin film (amorphous silicon film) formed on the surface of substrate 2. Substrate 2 is connected to ground potential 10 through rotating mechanism 9 and functions as the anode. Upper wall member 4a and lower wall member 4b comprising the reaction chamber wall are also connected to ground 10. There is provided a gas feeding pipe 6, for feeding a starting gas, that is constituted of quartz glass. Gas feeding pipe 6 is disposed to surround substrate 2 in such a manner that the starting gas is uniformly fed to the surface of substrate 2. A discharging system 7 is disposed under lower wall member 4b of the reaction chamber to keep the reaction chamber at a vacuum state. A thermocouple 11 is mounted to measure the temperature of substrate 2.

When the film formation is effected by means of the device in FIG. 1, the temperature of substrate 2 is elevated to a set temperature in advance by using a substrate heating member 8 mounted inside the substrate 2 and disposed on the substrate rotating mechanism 9, and then, for example, hydrogen gas and $SiH_4$ gas are introduced through the gas feeding pipe 6 into the reaction chamber. Then, a plasma discharge is excited between cylindrical wall member 1 and substrate 2 resulting in formation of an amorphous silicon film on the surface of substrate 2. Surfaces of metallic portions except for annular insulators 3a, 3b and gas feeding pipe 6 are coated with a metal film of Ni-Cr, for example, in advance.

The present invention will be described further with reference to several examples.

Example 1

Into a gas-phase method device in which the vacuum tank and the internal implements such as high frequency electrodes exposed to plasma atmosphere are constituted of a stainless steel such as SUS 304 steel or SUS 316 steel, under vacuum of $10^{-2}$ to $10^1$ Torr, a gas mixture of $CF_4$ gas and $O_2$ gas was introduced, and high frequency of 13.56 MHz was introduced from a high frequency radiation power source to generate plasma therein.

Etching working was performed by etching silicon, which is the material to be etched and placed in the plasma atmosphere, with fluorine radicals formed by the plasma reaction of the $CF_4+O_2$ gas mixture to convert silicon into gases such as silicon tetrafluoride ($SiF_4$), which was discharged out of the plasma tank by means of a mechanical booster pump and a rotary pump.

During the operation, the surface of the structure made of stainless steel exposed to the aforesaid plasma atmosphere reacted with fluorine radicals generated in the plasma, whereby a white powdery layer of $FeF_3$ with a thickness of some 100 Å was formed to cause contamination within the reactor by fluorine and also formation of dust.

On the other hand, when the same operation was conducted by coating the surface of the stainless steel structure with nickel plated coating, its surface could be prevented from deposition of the reaction product, exhibiting very good corrosion resistance to the corrosive fluorine type gas, and also no etching occurred on the nickel plated surface.

Also, when the same operation was conducted by coating the surface of said stainless steel structure with chromium plated coating, corrosion resistance comparable to the surface applied with nickel plating treatment was exhibited to the fluorine type corrosive gas, and there occurred also no etching on the plated surface.

Example 2

In Example 1, the frequency employed for the high frequency power source was made 13.56 MHz. Similar experiments were conducted for plasma etching devices which were used with a microwave 2.45 GHz or in the low frequency region less then 500 Hz to see the effect of the invention for improvement of corrosion resistance of structural members in the gas-phase method to fluorine type corrosive gases. As the result, similar effect as in Example 1 could be observed.

Example 3

Also by applying chromium plating on the surfaces of the inner walls of the reaction chamber and the internal implements within a plasma CVD device for formation of thin film of fluorinated amorphous silicon by glow discharging decomposition of a corrosive gas of $SiF_4$ within the device, generation of similar troubles by formation of $FeF_3$ through the reaction with the stainless steel surface with fluorine radicals could be prevented.

Example 4

In a plasma CVD device which forms amorphous silicon films with the use of $SiH_4$ gas, in carrying out cleaning within the vacuum tank by etching removal of the silicon compound adhered on the inner walls or internal implements during film formation with $CF_4$ gas, the inner portion of the plasma tank was previously subjected to nickel plating. As the result, there occurred neither contamination by fluorine within the plasma tank nor generation of dust by $FeF_3$, whereby the reaction chamber could be maintained in a very clean state and the amorphous silicon film formed after cleaning could be prevented from entrainment of impurities to enable preparation of semiconductor films with stable characteristics continuously.

Further, by application of nickel plating or chromium plating as the inner surface treatment on the stainless pipes and the vacuum evacuation pumps in the gas feeding system or evacuating system annexed to the gas-phase method device, corrosion resistance could be improved when employing a fluorine type gas.

What we claim is:

1. A treatment device utilizing plasma which performs treatment by exposing a material to be treated to a plasma atmosphere formed by converting at least either one of fluorine and a fluorine compound into gas plasma, which device comprises a structural member for forming the space for maintaining said plasma atmosphere, which is constituted of a stainless steel structure member coated on its surface exposed to said plasma atmosphere with a metal film which can difficultly form a fluoride.

2. A treatment device according to claim 1, wherein the metal film is a film of a metal selected from the group consisting of nickel, chromium, gold, aluminum, copper, silver and tin.

3. A treatment device according to claim 1, wherein the fluorine compound is a fluorinated hydrocarbon type gas.

* * * * *